United States Patent [19]

Patraw

[11] Patent Number: 4,716,049
[45] Date of Patent: Dec. 29, 1987

[54] COMPRESSIVE PEDESTAL FOR MICROMINIATURE CONNECTIONS

[75] Inventor: Nils E. Patraw, Redondo Beach, Calif.

[73] Assignee: Hughes Aircraft Company, Los Angeles, Calif.

[21] Appl. No.: 880,478

[22] Filed: Jun. 30, 1986

Related U.S. Application Data

[62] Division of Ser. No. 811,560, Dec. 20, 1985.

[51] Int. Cl.$^4$ ............................................. B05D 5/12
[52] U.S. Cl. ............................... 427/96; 427/259; 427/265; 427/266; 437/228
[58] Field of Search ............... 427/96, 82, 88, 259, 427/265, 266

[56] References Cited

U.S. PATENT DOCUMENTS

| | | | |
|---|---|---|---|
| 3,436,605 | 4/1969 | Landran | 357/74 |
| 3,811,186 | 5/1974 | Larnerd | 361/406 |
| 4,372,809 | 2/1983 | Grewal | 427/90 |
| 4,526,859 | 7/1985 | Christensen | 427/96 |
| 4,574,031 | 3/1986 | Dorey | 427/96 |

Primary Examiner—John D. Smith
Assistant Examiner—Vi D. Dang
Attorney, Agent, or Firm—Ronald L. Taylor; A. W. Karambelas

[57] ABSTRACT

Apparatus is disclosed for providing microelectronic, intra-chip and chip-to-chip interconnections in an ultra-dense integrated circuit configuration. Compressive pedestals 20 are used to form spring-loaded electrical and mechanical interconnections to conductive terminals on a chip interface mesa and chip assembly 28 in order to form a large multi-chip array 23 on an interconnection substrate 24. Methods are also disclosed for fabricating the compressive pedestals 20.

20 Claims, 8 Drawing Figures

COMPRESSIVE PEDESTAL FOR MICROMINIATURE CONNECTIONS

This is a division of application Ser. No. 811,560, filed Dec. 20, 1985.

BACKGROUND OF THE INVENTION

1. Cross Reference to Related Patent Applications.

The present patent application is related to two pending patent applications entitled "Inverted Chip Carrier" (Ser. No. 811,207, filed Dec. 20, 1985) and "Chip Interface Mesa" (Ser. No. 811,239, filed Dec. 20, 1985) both also invented by Nils E. Patraw and both assigned to the Hughes Aircraft Company.

2. Field of the Invention

The present invention pertains to Ultra-Dense, Extremely Large Scale Integration and wafer scale synthesis of microelectronis components residing on a large number of integrated circuits. The specific focus of the preferred embodiment is the planar and orthogonal space optimization of active microelectronic circuit elements which makes possible multi-chip VHSIC hybrids having extraordinarily high signal processing capabilities and enormous memory capacity.

3. Background Information.

Over the past four decades, the electronics industry has witnessed vast improvements in the performance of electronic components. The transition from thermo-ionic devices to solid state diodes and transistors was the first phase of intense efforts to miniaturize circuitry in order to construct powerful digital computers. The second great phase of innovation involved the consolidation of discrete solid state devices into a compact, unitary circuit which shared a single housing. Before the advent of integrated circuits, components like transistors were individually encapsulated in plastic cases or resided separately in metal cans. These single elements were generally mounted on circuit boards and each had a number of leads connected together by soldered wires. The first generation of integrated circuits combined many discrete active elements together on several alternating layers of metallic and dielectric films which were deposited on an insulating substrate. These early integrated circuits, called thin-film hybrids, were the precursors of current integrated circuits which contain a solitary, but extremely powerful and densely packed, semiconductor chip or die. This semiconductor chip comprises a base or substrate of material, upon which many thin layers are formed that are, in turn, coupled together by tiny, metallic interconnects or vias which pass vertically through the several horizontal layers. A semiconductive material such as silicon, germanium, or gallium arsenide can be chemically altered in order to form carefully selected, minute regions having different electrical properties. These distinct regions are now fabricated with great precision, and each region may measure less than one millionth of an inch. A few regions which exhibit different degrees of electrical conductivity can be grouped together in order to form a device that can help perform a mathematical calculation or store information. These groups of microscopically small regions or zones within one of the many layers of one monolithic chip are the modern analogs to the discretely packaged components which preceded them twenty and thirty years ago.

As each phase of electronic components produced improvement in calculation speed and memory capacity, the packaging of these components became more and more important. Technological advancements that solve problems concerning the fabrication or further miniaturization of semiconductor materials and devices simultaneously create a concomitant packaging problem. As circuit components shrink to increasingly smaller dimensions, the problems of accessing each component grows worse. When integrated circuits become so densely packed that a million of separate active devices occupy a space smaller than the diameter of the eraser on a common pencil, the difficulties involved in exchanging information in the form of electrical signals between that vast network of tiny circuit elements and the outside world become enormous.

Another level of complication is reached when designers attempt to connect many integrated circuits together in a unitary system. Semiconductor chips which are shorter than the width of the eraser at the end of the pencil and less than two one hundreths of and inch thick are manufacturer simultaneously by the hundreds on thin circular wafers of semiconductive material that are typically about four inches wide. Recent attempts to couple all the separate chips on the wafer gave rise to the term wafer scale integration. An electronic device which could incorporate tens, hundreds, or perhaps even thousands or millions of already immensely powerful separate chips, each comprising roughly a million active components, together on one wafer would constitute a tremendous technological leap forward in the electronics arts.

Among the most serious problems encountered in designing and manufacturing integrated circuits and multiple integrated circuit arrays are the deleterious consequences of using fine filaments of wire to connect the miniscule terminals or pads which are the access points to the outside world from the internal circuitry of the integrated circuit. These fragile, very light gauge connecting wires are typically one one-thousanth of an inch in diameter. One common technique for attaching these wires or leads to the conductive external terminals of the chip is thermocompression bonding. This process combines the application of heat and stress on an integrated circuit die. A very small wedge-shaped probe or tool called a bonding wedge must be viewed through a microscope and guided over a wire which is to bonded onto a conductive pad. The pad is usually located at the periphery of the semiconductor chip or die, which is placed on a heating device in order to soften the metallic material comprising the pad. A refinement of the bonding wedge is called a nailhead or ball bonder, in which the pressure bonding tool consists of a glass capillary tube that feeds the wire through its center to the pad. A flame melts the end of the wire that protrudes out of the open end of the capillary tube and forms a ball having a diameter about twice the thickness of the wire. The wire is then retracted in the tube and the ball is held snugly against the orifice while the tube is moved over the pad and impressed upon it with considerable force. The compression deforms the ball into a flattened thermocompression bond shaped like the head of a nail. The tube is then pulled back from the pad, and the flame is employed again to melt the wire which is now attached to a pad on the die. The wires and the contact pads are typically made of gold or aluminum.

Although thermocompression bonding has proven useful over many years of manufacturing, this method suffers from many shortcomings. Aside from the great expense incurred in either bonding wires and pads manually or with the aid of costly automated equipment, any mechanical connection like a pressure bond is susceptible to failure caused by a multitude of environmental factors. Since any fabrication process will be less than perfect, some wirebonds will be faulty after manufacturing. Even if only one precent of the connections are inadequate, the entire electronic system which includes the chip with the bad connection may be rendered completely inoperative as a consequence. Different rates of expansion and contraction of the connected materials due to changes in temperature will tend to destroy bonds over time. The ambient environment may contain compounds which will initiate chemical processes such as oxidation that may corrode and destroy metallic connections. The installation of subcomponents, handling, or vibration encountered during use may detach these wire bridges in time.

In addition to the nettlesome problems of keeping a wire bond intact over the life of an electronic device, this mode of connecting portions of one chip or an array of many chips is beset by problems even if all the bonds are perfectly made and are never broken. The vast number of wire bonds needed to connect large numbers of chips result in an enormous total length of conductive pathways in the system circuit. These conductors consume electrical power since they are resistive components. Increased ambient temperature caused by this thermal heating may impair the operation of the associated integrated circuits. The wires inject unwanted inductance and capacitance into otherwise precisely balanced circuits. Crosstalks between conductors may severely impair the performance of the entire system. Time delays inherent in the long pathways reduce computation capability.

Perhaps the worst problem is the enormous space which is wasted when wires are used to connect together portions of a chip or an array of many chips. Each span of wire that connects two points which reside substantially in the same plane requires a looped, generally parabolic length of bent wire. The amount by which the wire can be bent is limited by the fragility and susceptibility of the wire to fracture. In addition, the size of the wire bonding tool mandates a minimum spacing between contact points which receive thermocompression bonds. These loops of wire impose limits on the horizontal density of the chip deployment, since a minimum space for each loop must be provided between each adjacent chip. Conventional wire bonding techniques impose die interspacing contraints of no less than twice the thickness of the die. If the die is on the order of twenty mils of an inch in height, as much as fifty mils will be wasted in order to provide adequate separation for the making the wire bonds. The pads which receive the wire bonds also consume precious space on the die. Each pad must be large and sturdy enough to tolerate the great pressure transmitted by the wire bond tool. The wire bonds not only consume valuable horizontal surface area on the face of the die, but also take up space above the plane of the die. The looped portions of the connecting wires can extend far above the die face and preclude the stacking of several levels of chip array planes.

When connecting wires consume space above or below the active die surface, the vertical or orthogonal space that extends perpendicular to the active circuitry must be reserved for protruding wires. These exposed wires are vulnerable to a host of environmental hazards including physical shock, vibration, extremes of temperature and damage during the assembly process.

Previous microcircuit connection and wafer scale integration inventions have attempted to solve the deployment and packaging problems inherent in combining and connecting millions of active circuit components using a variety of approaches. In U.S. Pat. No. 3,436,605, Landron describes a packaging process for semiconductor devices that includes conductive pathways deployed on a substrate which terminate in a plurality of spaced rounded pedestals which have bonding surfaces. Landrons's pedestals may have hemispherical tips and can be arranged in a triangular pattern on a header which also holds individual transistors.

Wakely discloses modular packages for semiconductor devices in U.S. Pat. No. 3,483,308. Wakely's design incorporates a rectangular body of insulating material having a flat upper surface which retains a semiconductor chip coupled to conductive pathways using looped wirebonds. The conductive pathways are also connected through the center of the rectangular body to downwardly depending pedestals. The pathways terminate at the ends of the pedestals where they are electrically coupled to a printed circuit board.

In U.S. Pat. No. 4,179,802, Joshi et al. explain a studded chip attachment process. Metal studs are plated on a chip carrier surface to match a terminal metal footprint of a corresponding chip. Chips are attached to a carrier by joining metal pads on the chip to corresponding studs on a silicon substrate of the carrier. A very small amount of solder is used to complete the bond between the studs and the pads.

Robillard et al. disclose an integrated test and assembly device in U.S. Pat. No. 4,189,825. This invention includes an integrated circuit device, a package frame having conductive leads that extend through an insulative portion of the package, and an interconnection substrate having apertures for receiving chips.

A method for employing precision stamping for fabricating wafers in a multi-wafer circuit structure is disclosed in U.S. Pat. No. 3,813,773 by Parks. This invention employs a plurality of conductive wafers which are stacked together under pressure in order to form a parallelpiped structure containing integrated circuit chips. Parks uses a uniform rectangular matrix of z-axis slugs separated by dielectric material as terminals for connecting the integrated circuits to external devices.

In U.S. Pat. No. 2,850,681, Horton discloses a subminiature structure for electrical apparatus which includes a combination of a plurality of wafers made of rigid insulating material, conductors fixed to each wafer, and connections between the electrical components on these wafers.

Vizzer describes a modular component printed circuit connector in U.S. Pat. No. 3,107,319. This invention uses a modular component base block which is attached to printed circuit boards having end slots for the insertion of circuit connector elements that are retained by spring loaded terminals.

A flat package for semiconductors which includes an insulating ceramic substrate having a channel that receives a semiconductor wafer that is bonded to a gold surface is disclosed in U.S. Pat. No. 3,271,507 Elliott.

In U.S. Pat. No. 4,288,841, Gogal describes a semiconductor device including a double cavity chip carrier which comprises a multi-layer ceramic sandwich structure that has a pair of chip cavities. The inventor claims that this structure is useful for connecting two integrated circuits which have different terminal patterns.

Minetti reveals a method of forming circuit packages using solid solder to bond a substrate and contact members in U.S. Pat. No. 4,332,341. Minetti's ceramic chip carrier includes a ceramic body with castellations formed at the edges of the carrier surfaces. Multi-layer contact members are coupled to contact pads which are, in turn, connected to leads from an integrated circuit chip.

Hall et al. explain a method of fabricating circuit packages which employ macro-components mounted on supporting substrates in U.S. Pat. No. 4,352,449. In order to maintain sufficient clearance between components and the substrate and to achieve high reliability bonds, Hall employs massive solder preforms which are applied to contact pads on either the components or the substrate. This invention also involves the bonding of lead-tin solder spheres having a diameter of twenty to forty mils to contact pads on a chip carrier.

In U.S. Pat. No. 3,811,186, Larnerd et al. describe a method for aligning and supporting microcircuit devices on substrate conductors when the conductors are attached to the substrate. A shaped, flexible, insulative material placed between the devices and their corresponding conductors supports terminals which can be fused together with heat in order to attach conductors after they have been properly aligned.

Beavitt et al. disclose an integrated circuit package including a number of conductors bonded between a cover and a cavity formed within a base that holds a chip in U.S. Pat. No. 3,825,801. This cavity serves as a carrier for the chip, which is held in place between conductive strips of resilient material that are secured between a base and cover of insulating material.

A process for producing sets of small ceramic devices such as leadless inverted chip carriers that have solderable external connections is disclosed by Hargis in U.S. Pat. No. 3,864,810. After firing several layers of ceramic material on a base sheet, Hargis mounts a chip on the ceramic carrier by embedding or encapsulating it in an epoxy resin order to provide leads for the chip which are more easily connected to external devices than the chip terminals themselves.

In U.S. Pat. No. 3,868,724, Perrino reveals connecting structures for integrated circuit chips which are fabricated by forming many sets of leads on a flexible tape. These leads penetrate through holes formed in the tape and terminate in contacts which are arranged in a pattern that corresponds to a pattern of contacts on an integrated circuit chip. The chips are enclosed by an epoxy encapsulant after they are bonded to the contacts.

Hartleroad et al. explain a method and apparatus for positioning semiconductor flip chips onto one end of a transfer probe which automatically and magnetically aligns the chips and bonds them to an overlying lead frame structure. Their method for placing flip chips into one end of an elongated groove of a positioning apparatus and conveying them on guide rails using a magnetic force to properly locate the chips before bonding is the subject of U.S. Pat. No. 3,937,386.

An electrical package for Large Scale Integrated devices which utilizes solder technology to interconnect a carrier, a circuit transposer and LSI devices is described by Honn et al. in U.S. Pat. No. 4,074,342. The Honn electrical package includes a carrier which has a thermal expansion coefficient similar to semiconductive material, a standard array of terminal pins, and the transposer, which they claim eliminates mechanical stress on solder joints that is caused by dissimilar thermal expansion of the various packaging materials.

Inoue discloses a semiconductor device insulation method in U.S. Pat. No. 4,143,456. This invention employs a protective covering for a semiconductor device which includes a circuit board bearing a conductive pattern and a chip. Inoue fixes his chip with a eutectic or electrically connected adhesive to a die bonded portion of the circuit board pattern with aluminum wire.

U.S. Pat. No. 4,147,889 Andrews et al. describe a thin, dielectric, dish-shaped chip carrier which has flexible mounting flanges having plated or bonded solderable conductive traces and paths. These traces and paths are coupled with plated or bonded heat sinks which are electrically grounded and provide structural integrity.

A flat package for an integrated circuit device that has output pads comprising a supporting member for the integrated circuit device, external output terminals, and array of output conductors, and an electrically insulating encapsulation cover is illustrated in Ugon's U.S. Pat. No. 4,264,917. This invention includes contact islands arranged on a supporting wafer to provide a package for one or more integrated circuit devices having a reduced thickness and surface area.

None of the inventions described above solves the problem of wasted planar and orthogonal space that results from the high portion of chip assemblies that are devoted to chip interconnections such as wirebonds. None of these prior methods or apparatus provides an effective and comprehensive solution which addresses all of the complex aspects of achieving ultra-high density of active semiconductor components. Such a solution to this problem would satisfy a long felt need experience by the semiconductor and integrated circuit industries for over three decades.

A truly practical and reliable means for producing efficacious intra-chip and chip-to-chip interconnections without squandering a substantial portion of the die's planar and orthogonal space would constitute a major advancement in the microelectronics field. Manufacturers of semiconductor dies could employ such an innovative design to produce integrated circuits capable of processing information at speeds greatly exceeding the current state of the art and and capable of storing vast quantities of data far beyond today's most densely packed designs. Such an invention would ideally be suited to operate in cooperation with a wide variety of computing systems and would perform consistently and reliably over a wide range of operating conditions and system applications. Extremely Large Scale Intergration microcircuity would also satisfy the rigorous demands of supercomputers and orbital defense systems. An invention which enables aerospace microelectronic designers to deploy enormously powerful yet extremely compact integrated circuits in orbit for space defense systems would most certainly constitute a major technological advancement in the electronics arts.

SUMMARY OF THE INVENTION

The aim of the present invention is to help accomplish this major technological advancement. The Patraw Compressive Pedestal for Microminiature Connections enables designers of integrated circuits to connect the integrated circuits together in order to form unitary, on-wafer chip arrays which have signal processing and memory capacities that dwarf previous previous discretely connected, multiple integrated circuit systems. The present invention extends the current state of the art beyond Very Large Scale Integration (VLSI) capabilities to the higher range of Ultra-Dense, Extremely Large Scale Integration (ELSI) using the wafer scale synthesis techniques described and claimed below.

The present invention is, in its best mode of implementation, designed to be used with the Chip Interface Mesa, which was also invented by Nils E. Patraw and is described in a copending patent application having that title which is also commonly assigned to the Hughes Aircraft Company. The chip interface mesa is fabricated from an dielectric material and has a generally rectangular shape having dimensions that are generally slightly smaller than the semiconductor die upon which it resides. The mesa has a rectangular cross-section and may be epoxied to the top of the die which bears the uppermost level of active circuitry. The perimeter of the mesa is populated by vertical channels or notches which are coated with a layer of conductive material. The top face of the mesa contains an array of conductive regions or external interface pads which are much larger than conventional bond pads. These external interface pads are electrically coupled to a notch on the side wall of the mesa by a thin conductive pathway. Each notch in the mesa is aligned with a conductive chip interface pad on the semiconductor chip. The chip interface pads are deployed on the periphery of the top surface of the chip which is bonded to the mesa. A drop of heated solder or other easily deformable conductive material is placed in each notch from above the mesa and forms an electrical link between the mesa and a chip interface pad, since the solder joins with both the pad and the vertical walls of the notch.

This microelectronic packaging configuration constitutes an important improvement and refinement of the Patraw Inverted Chip Carrier, which substantially eliminates long looped wirebonds by redirecting intra-chip and chip-to-chip interconnections to orthogonal space over the active circuitry of the chip. The Chip Interface Mesa eliminates wirebonds completely. All undesirable wire couplers are supplanted by durable and easily formed solder droplet connections inside a notch which is in registry with a corresponding chip pad. The repositioning of intra-chip and chip-to-chip interconnections into space over the active circuitry optimizes packaging space for integrated circuit assemblies and enables designers to approach the theoretical density limit for semiconductor devices due to the enormous saving of space which was once wasted by wirebonds between adjacent chips. The Chip Interface Mesa reserves nearly all of the planar space of a multi-chip array for active semiconductor circuitry, and banishes inefficient interconnection space to a volume over or orthogonal to the plane of the active circuitry. That important new integrated circuit assembly design not only optimizes packaging criteria, but also permits the stacking of many parallel levels of contiguous chips with a minimum of costly inter-chip spacing. By connecting many chips together, many semiconductor dies on a wafer can be combined in order to realize full, wafer-scale reconstruction.

The present invention is yet another evolution of the innovative concepts disclosed and claimed in the co-pending patent applications entitled "Inverted Chip Carrier" and "Chip Interface Mesa." The Compressive Pedestal for Microminiature Connections is a body of conductive material having a upper portion and at least three legs which extend from the upper portion. The legs terminate in flared contact pads which are capable of securely mating to a substantially flat conductive pad in order to form a reliable electrical coupling. These legs are designed to mate to one of the mesa interface pads on the Chip Interface Mesa. The pedestal is formed from a metal which is flexible and will provide an oppositely directed spring tension when the entire pedestal is subjected to a loading force that presses it against a mesa interface pad. By using a compressive pedestal with a chip interface mesa and chip assembly as described and claimed in the related patent application, a greatly improved packaging array for integrated circuits which enables virtual wafer scale reconstitution leading to system densities that exceed current VLSI technology is made possible. The compressive pedestal may be used to fabricate chip interface mesa arrays that combine hundreds or thousands of interconnected chip interface mesa and chip assemblies. Single chip carriers may be constructed using the present invention in a spring-loaded receptacle which provides easy access and replacement of the chip.

It is, therefore, an object of the present invention to provide a simple, reliable means of connecting large arrays of interconnected integrated circuit assemblies using a device which is easily and cost-effectively mass produced.

It is an object of this invention to provide a microelectronic interconnection device which does not destroy its corresponding chip or carrier when the sub-components of an integrated circuit assembly such as a chip interface mesa and chip assembly are separated so that chips may be repeatedly tested, probed, or replaced without destroying the means which incorporates it into a large, complex system of integrated circuits.

A further object of the present invention is to provide an integrated circuit packaging solution which does not adversely affect the yield of expensive chips during the chip manufacturing process.

It is an object of the present invention to provide an apparatus for microelectronic interconnection which completely eliminates undesirable and unreliable wirebonds.

Another object of the present invention is to provide apparatus for micro-miniature electronic interconnection which maximizes the density of active, integrated circuit devices in given volume.

Another object of this invention is to provide a simple and reliable means of connecting circuits within a chip or connecting circuits within many different chips in order to make previously impossible wafer-scale synthesis designs practical and cost-effective.

Still another object of the present invention is to provide a means of connecting large numbers of semiconductor dies using currently commercially available dies and existing packaging technology.

Yet another object of the invention is to provide chip arrays having increased system speeds due to drastic reductions in progapation delay times which results from the total elimination of interconnecting wires.

It is also an object of this invention to provide a chip carrier which enable designers to take advantage of enormous reductions in power consumption, since the elimination of a multitude of long wirebonds dispenses with a primary source of wasteful, capacitive loading.

Another object of the present invention is to provide a method of installing many chips together on a chip carrier which may be easily tested, inspected, burned-in, and repaired.

Still another object of this invention is to provide a chip deployment scheme which minimizes chip-to-chip input/output requirements.

Yet another object of the invention claimed below is to provide apparatus for microelectronic interconnection which avoids the deleterious additional capacitance and inductance that are introduced by prior devices which incorporate many long wire connectors within integrated circuit assemblies.

It is also an object of the present invention to cut down the mass of integrated circuit systems in order to fabricate systems which can be economically placed in an orbital environment.

An appreciation of other aims and objects of the present invention and a more complete and comprehensive understanding of the this invention may be achieved by studying the following description of a preferred embodiment and by referring to the accompanying drawings.

DESCRIPTION OF A PREFERRED EMBODIMENT

The chip and chip interface mesa assembly which may be employed in combination with the compressive pedestal is fully described in detail in a copending patent application entitled "Chip Interface Mesa" by Nils E. Patraw. The description of that invention, including the drawings figures contained in that patent application, are hereby incorporated into the present patent application by reference.

Figure 1A:
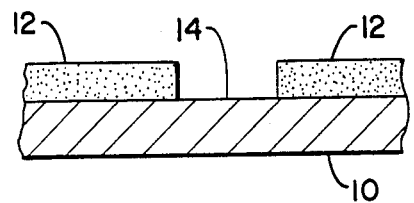
FIGS. 1a through 1e illustrate a preferred method of fabrication of the present invention by showing the various stages of formation of the compressive pedestal on a substrate.
Figure 1B:
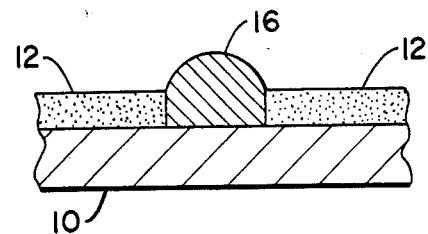
Figure 1C:
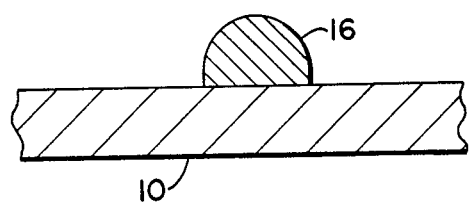
Figure 1D:
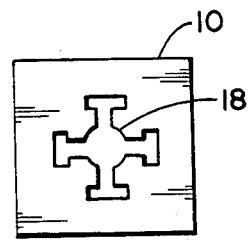
Figure 1F:
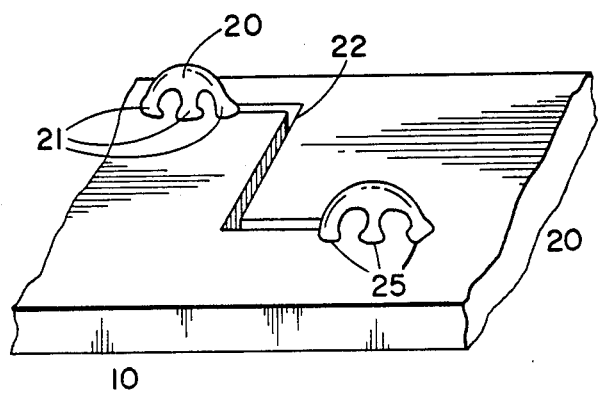
FIG. 1f is a perspective view of two completed compressive pedestals on a substrate that are connected by conductive pathways.
Figure 1E:
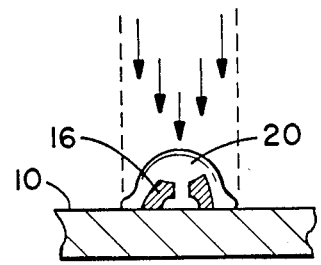

FIGS. 1a through 1e depict the sequence of operations employed to fabricate the preferred embodiment of the compressive pedestal. A substrate 10 is covered or screened with wax, photoresist, thermoplastic, or metal substrate mask 12 which has a pattern of circular holes 14 that are approximately 4 to 12 mils across. The holes 14 are filled with a material such as potassium chloride or photoresist to a level at which a positive meniscus is formed (FIG. 1b). A rounded pillar 16 is formed within each hole 14. The substrate mask 12 is removed with a suitable dissolving substance which leaves only the pillar 16 on the substrate 10 (FIG. 1c). In FIGS. 1d and 1e, a metal mask 18 having a central body portion and four radially extending members is placed over pillar 16 in order to deposit a layer of aluminum over the pillar 16. FIG. 1f reveals two finished compressive pedestals 20 having four downwardly depending legs 21 that terminate in flared, generally flattened pads 25. The pedestals 20 sit atop a substrate 10 and are connected by a conductive pathway 22. The pedestals 20 are designed to be deployed upon the mesa interface pads shown in the related copending patent application entitled "Chip Interface Mesa". In order to form a reliable bond between the pedestal and the conductive surface which receives it, the pedestals are coated with an indium alloy in an environment heated to approximately 150 degrees Centigrade.

Figure 2:
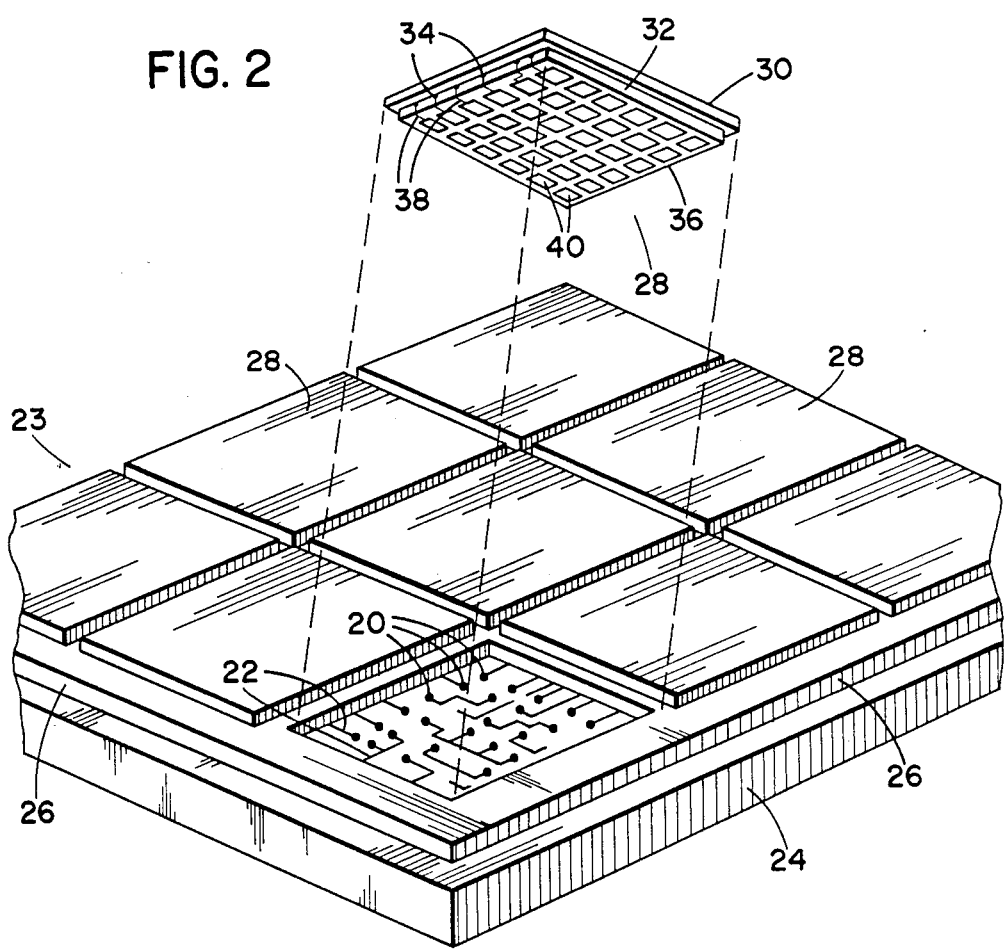
FIG. 2 is a perspective view of a multi-chip array of chip and chip interface mesa assemblies retained in and linked by corresponding receptacles by compressive pedestals which are, in turn, linked to an interconnection device.

FIG. 2 illustrates a multi-chip array which includes many chip interface mesa and chip assemblies 28 in a matrix like arrangement. Each assembly 28 is retained in a receptacle containing a plurality of corresponding compressive pedestals 20 which are connected to conductive pathways 22 that are, in turn, electrically coupled to external terminals (not shown) associated with interconnection substrate 24. The receptacles are arranged on substrate 24 atop an alignment spacer 26. Each assembly 28 comprises a chip 30, a mesa member 32, notches 34 bearing connective solder droplets (not shown in this drawing), and a matrix of oversized mesa interface pads 40 deployed atop a planar mesa surface 36 of their corresponding mesa member 32. The pads 40 are connected to their respective chip 30 via conductive pathways 38 and are electrically coupled to the multi-chip array 23 via the compressive pedestals 20.

Figure 3:
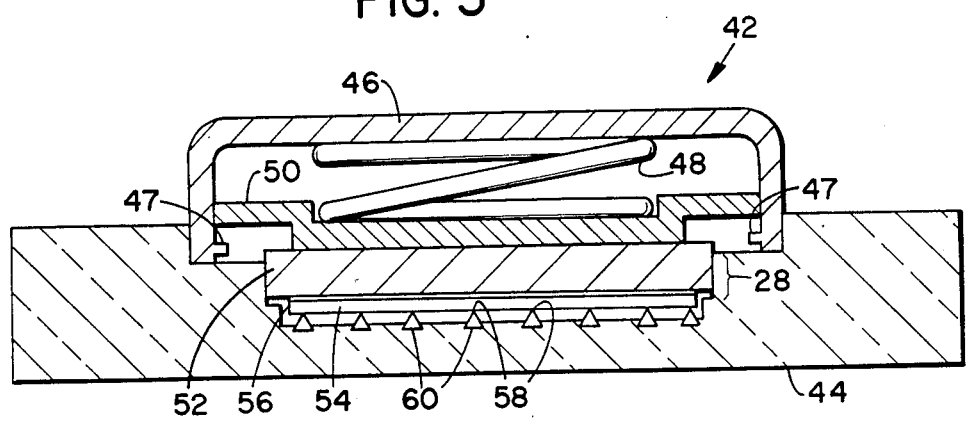
FIG. 3 is side cross-sectional view of a single chip carrier using compressive pedestals to retain and link a chip.

FIG. 3 depicts a single chip carrier 42 using compressive pedestals 20. A ceramic body 44 contains a receptacle which holds a chip interface mesa and chip assembly 28. A removable cover 46 secured by a retaining ring 47 holds a conventional spring 48 in place over a piston 50. The piston 50 provides a continuous pressure which holds assembly 28, including chip 52, mesa member 54, and solder droplets 56, against terminals 60 at the bottom of the receptacle. The terminals 60 are connected to internal connectors (not shown) within the ceramic body 44 which are, in turn, linked to external terminals or edge contacts (not shown) at the periphery of ceramic body 44.

The Patraw Inverted Chip Carrier, which is described in detail in a related copending patent application, enables a designer ordinarily skilled in the art to take a current, commercially available chip, place that chip in this new carrier, and realize an enormous increase in volume available for active circuitry of 65% for only a tiny 3% increase in planar area compared to the bare die dimensions. The Patraw Chip Interface Mesa provides even greater volume to surface area ratios by completely eliminating all wirebond. Nearly all the inter-chip spacing required in conventional manufacturing techniques is avoided by employing solder droplets in mesa receptacles that extend perpendicular to the plane of the chip's active circuitry to form the electrical interconnections between the chip and the outside world. The Patraw Compressive Pedestal for Microminiature Connections combines the advantages of the previous two inventions with another great benefit of designing large multi-chip arrays in which the component chips are packaging in an ultra-dense configuration and are easily replaced or removed.

Although the present invention has been described in detail with reference to a particular preferred embodiment, persons possessing ordinary skill in the art to which this invention pertains will appreciate that various modifications and enhancements may be made without departing from the spirit and scope of the invention.

What is claimed is:

1. A method for making a resilient microelectronic connective member including the steps of:
   providing a substrate for forming said resilient microelectronic connective member;
   covering said substrate with a substrate mask having an aperture;
   filling said aperture with a filling material which will form a positive meniscus at the top boundary of said substrate mask in order to form a rounded pillar on said substrate within said aperature;
   dissolving said substrate mask with a dissolving substance that will remove said substrate mask from said substrate but that will leave said pillar intact on said substrate;
   impressing a pedestal design mask over said pillar;
   depositing a layer of metal over said pedestal design mask in order to form a resilient microelectronic connective member; and
   dissolving said pillar with a dissolving substance that will remove said pillar but that will leave said resilient microelectronic connective member on said substrate.

2. A method for fabricating a compressive pedestal for microminiature connections including the steps of:
   providing a multi-layer, dielectric substrate for forming said compressive pedestal for microminiature connection;
   covering said substrate with a photoresist substrate mask having a cylindrical holes;
   depositing potassium chloride in said hole in order to form a pillar having a generally rounded top portion of said substrate within said cylindrical hole;
   dissolving said photoresist substrate mask with a dissolving substrate that will remove said photoresist substrate mask from said substrate but that will leave said pillar intact on said substrate;
   impressing a pedestal design mask over said pillar;
   depositing a layer of aluminum over said pedestal design mask in order to form a compressive pedestal for microminiature connection; and
   dissolving said pillar with a dissolving substance that will remove said pillar but that will leave said compressive pedestal for microminiature connection on said substrate.

* * * * *